United States Patent [19]
Nakao

[11] Patent Number: 5,597,667
[45] Date of Patent: Jan. 28, 1997

[54] PHOTOMASK AND PHOTOMASK BLANK

[75] Inventor: Shuji Nakao, Hyogo, Japan

[73] Assignee: Mitsubishi Denki Kabushiki Kaisha, Tokyo, Japan

[21] Appl. No.: 316,498

[22] Filed: Sep. 30, 1994

[30] Foreign Application Priority Data

Dec. 27, 1993 [JP] Japan .................................. 5-330802

[51] Int. Cl.$^6$ ........................................................ G03F 9/00
[52] U.S. Cl. ............................ 430/5; 430/321; 430/322; 430/369
[58] Field of Search ............................... 430/5, 321, 322, 430/369

[56] References Cited

U.S. PATENT DOCUMENTS 5,338,647  8/1994  Nakagawa et al. .................... 430/322

OTHER PUBLICATIONS

"NA and σ Optimization for High NA I–Line Lithography", Koji Yamanaka et al., SPIE, vol. 1927, pp. 310–319 (1993).
"0.35 UM Lithography Using Off–Axis Illumination", Paul Luehrmann et al., SPIE, vol. 1927, pp. 103–123 (1993).
"New Resolution Enhancing Mask For Projection Lithography Based on In–Situ Off–Axis Illumination", Rainer PFORR et al., SPIE, vol. 1927, pp. 190–213 (1993).

*Primary Examiner*—S. Rosasco
*Attorney, Agent, or Firm*—Lowe, Price, LeBlanc & Becker

[57] ABSTRACT

A photomask used in photolithography is characterized in that the photomask is provided with a transparent substrate having two opposite main surfaces and a light-shielding pattern formed on one main surface, that the other main surface includes a plurality of irregularly distributed concaves and convexes, and that a spacing and a height of the concaves and convexes are within a range from 50 to 1000 times a wavelength of light used in photolithography.

4 Claims, 7 Drawing Sheets

PHOTOMASK AND PHOTOMASK BLANK

BACKGROUND OF THE INVENTION

1. Field of the Invention

The present invention relates to a photomask used in photolithography which is one of the processes of manufacturing a semiconductor integrated circuit, and more particularly, to a photomask which can contribute to the improvement of process latitude in photolithography.

2. Description of the Related Art

FIG. 7 schematically illustrates an optical system of an optical stepper used in photolithography which is one of the manufacturing processes of a semiconductor device. The optical stepper is an apparatus for reduction-projecting a pattern of a photomask onto a semiconductor substrate. Such an optical stepper includes an illumination optical system from the pattern of the photomask to a light source, and a projection optical system from the pattern on the photomask to the semiconductor substrate. The pattern of the photomask is transferred to a whole semiconductor wafer in a step-and-repeat manner.

The stepper of FIG. 7 is provided with a mercury lamp 10 as a light source. KrF excimer laser can be used instead of the mercury lamp, if desired. A fly-eye lens 11 acts to approximate light radiated from a point light source 10 to light radiated from a planar light source. A stop is placed in a pupil (Fourier plane) 12 of the illumination optical system. A pattern of a photomask 1 is illuminated with light passing through a condenser lens 13. The light passing through the pattern of photomask 1 is focused on a semiconductor wafer 16 by a reduction-projection lens 14. A stop is also placed in a pupil 15 of the projection optical system.

FIG. 8 is a schematic cross section of a conventional photomask used in the optical stepper shown in FIG. 7. Photomask 1 includes a transparent substrate 2. Transparent substrate 2 has two main surfaces 2a and 2b smoothly polished and opposite to each other. A light-shielding pattern 3 is formed on one main surface 2a. Light-shielding pattern 3 can be formed, for example, of a Cr film or a complex film of a Cr film and a CrOx film.

When degree of integration of a semiconductor integrated circuit is enhanced, the improvement of resolution and of the depth of focus in photolithography is desired. If a wavelength of light used in photolithography is made shorter, resolution and the depth of focus may both be improved. In addition, resolution tends to be improved in proportion to an increase in a numerical aperture NA of the optical stepper. However, the depth of focus tends to be reduced in inverse proportion to the square of the numerical aperture NA. Accordingly, when a pattern is transferred with reduced depth of focus to a wafer having a difference in level, which is under the manufacturing process of the semiconductor integrated circuit, sufficient contrast can be obtained only at an upper level or a lower level of the wafer, resulting in low process latitude. Therefore, it is important to prevent reduction in the depth of focus, when the process latitude of the optical stepper is to be enhanced.

In order to achieve greater depth of focus without reducing resolution in the optical stepper, it is desired to make a coherence value σ larger. The relationship between the coherence value σ and the depth of focus is described, for example, in SPIE, Vol. 1927, pp. 310–319 (1993) by Yamanaka et al. The coherence value σ is defined by the following equation (1)

$$\sigma = NA_1/NA_2 \quad (1)$$

where $NA_1$ is the numerical aperture of the illumination optical system and $NA_2$ is the numerical aperture of the projection optical system.

The numerical aperture $NA_2$ of the projection optical system is desired to be as large as possible in order to achieve improved resolution. The maximum numerical aperture $NA_2$ of the projection optical system in the optical stepper is, however, about 0.6, due to the limitation of diameter and efficiency of a lens used. In the optical stepper, the numerical aperture $NA_2$ of the projection optical system is maintained to a desired constant value. Accordingly, in order to achieve larger coherence value σ, the numerical aperture $NA_1$ of the illumination optical system is required to be made larger. The numerical aperture $NA_1$ of the illumination optical system is determined mainly by the size of the aperture in the stop placed in pupil 12.

In FIG. 9, an example of the stop placed in pupil 12 of the illumination optical system is schematically illustrated. The stop of FIG. 9 is used in the normal illumination, and includes a light-shielding circular plate 12A and a circular aperture 12a provided in the center thereof. Therefore, illumination light passes through aperture 12a in a stop 12A, and the value of the numerical aperture $NA_1$ of the illumination system is determined mainly by the size of diameter of aperture 12a. In other words, the coherence value σ can be increased by making aperture 12a in stop 12A larger. Thus, the depth of focus is improved by the increased value of σ, resulting in the improvement of process latitude upon projecting light on the semiconductor substrate. However, the increase in the diameter of aperture 12a in stop 12A is limited by diameter and efficiency of the lens used in the illumination optical system.

In recent years, off-axis illumination has been studied in order to achieve greater depth of focus in the optical stepper. The principle of the off-axis illumination is described, for example, in SPIE, Vol. 1927, pp. 103–123 (1993) by Luehrmann et al.

FIGS. 10 and 11 show examples of a stop used in pupil 12 of the illumination optical system in the off-axis illumination. The stop of FIG. 10 is used when a mask pattern including a plurality of equally spaced parallel lines are transferred to the semiconductor substrate. Then, the stop is placed such that a line linking the centers of two apertures 12b in stop 12B is perpendicular to the lines of the mask pattern. Four apertures 12c in point symmetry with respect to the center of light-shielding circular plate 12C are located in the stop of FIG. 11. This stop is used in the off-axis illumination for transferring a two-dimensional fine pattern.

As described above, since coherency of conventional illumination light is controlled by regular spacial positioning of the apertures in the stop, the effect of improving contrast of projected image is obtained for a specific pattern suitable for the regular spacial positioning of the apertures. However, it has adverse effects such as distortion of image and reduction of contrast on a pattern not suitable for the regular spacial positioning of the apertures.

FIG. 12 is a graph showing the relation between a line width transferred and the depth of focus in the off-axis illumination. In this graph, the abscissa indicates the line width and the ordinate indicates the depth of focus. Curve A indicates the depth of focus in the off-axis illumination using the stop shown in FIG. 10, while dashed curve P indicates the depth of focus in the normal illumination using the stop shown in FIG. 9. As understood from FIG. 12, in the off-axis illumination, greater depth of focus is obtained for a pattern having a specific line width. For a pattern having a different line width from the specific one, however, the depth of focus in the off-axis illumination is smaller than that in the normal illumination. The effect of the relation between positioning of the apertures in the stop used in this off-axis illumination and a mask pattern on the depth of focus is described, for example, in SPIE, Vol. 1927, pp. 190–213. That is, in the off-axis illumination, there is a problem that the depth of focus can be improved only for a specific pattern and not for all the patterns.

SUMMARY OF THE INVENTION

In view of the above-described problems, it is an object of the present invention to provide a photomask in which greater depth of focus and improved process latitude can be achieved for an arbitrary pattern.

According to one aspect of the present invention, a photomask used in photolithography is characterized in that the photomask is provided with a transparent substrate having two opposite main surfaces and a light-shielding pattern formed on one of the two main surfaces, that the other main surface includes a plurality of irregularly distributed concaves and convexes, and that a spacing and a height of the concaves and convexes are within a range from 50 to 1000 times as large as a wavelength of light used in photolithography.

According to another aspect of the present invention, a photomask blank for manufacturing a photomask used in photolithography is characterized in that the photomask blank is provided with a transparent substrate having two opposite main surfaces, a light-shielding layer formed on one of the two main surfaces, and an electron beam resist or a photoresist layer formed on the light-shielding layer, that the other main surface includes a plurality of irregularly distributed concaves and convexes, and that a spacing and a height of the concaves and convexes are within a range from 50 to 1000 times as large as a wavelength of light used in photolithography.

In the photomask provided by the present invention, illumination light is directed through one main surface having concaves and convexes to a light-shielding pattern on the other main surface. At this time, the irregularly distributed concaves and convexes cause scattering refraction of incident light. Accordingly, in wave number space, wave number in the direction perpendicular to an optical axis of the incident light increases and is uniformly distributed. As a result, coherency of the illumination light radiated to the light-shielding pattern can be made smaller (that is, coherence value σ can be made larger), resulting in the improvement in process latitude for an arbitrary pattern.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
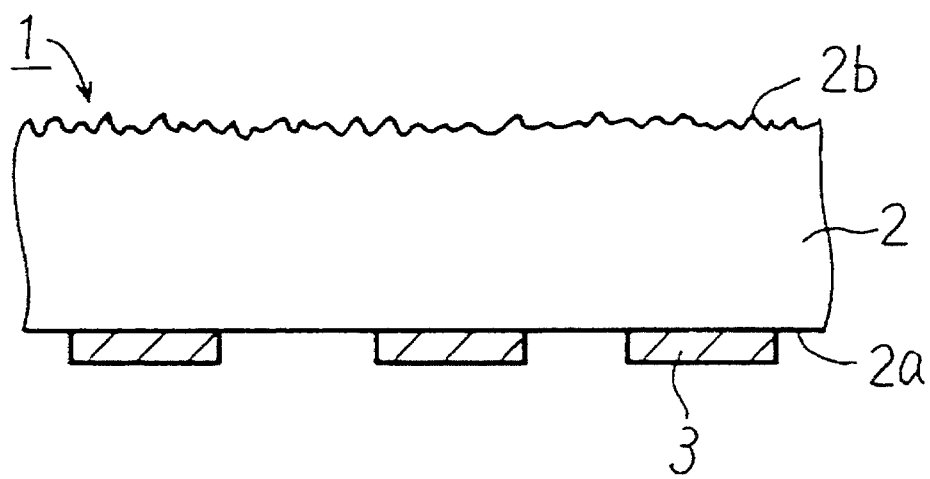
FIG. 1 is a schematic cross section of a photomask according to one embodiment of the present invention.
Figure 7:
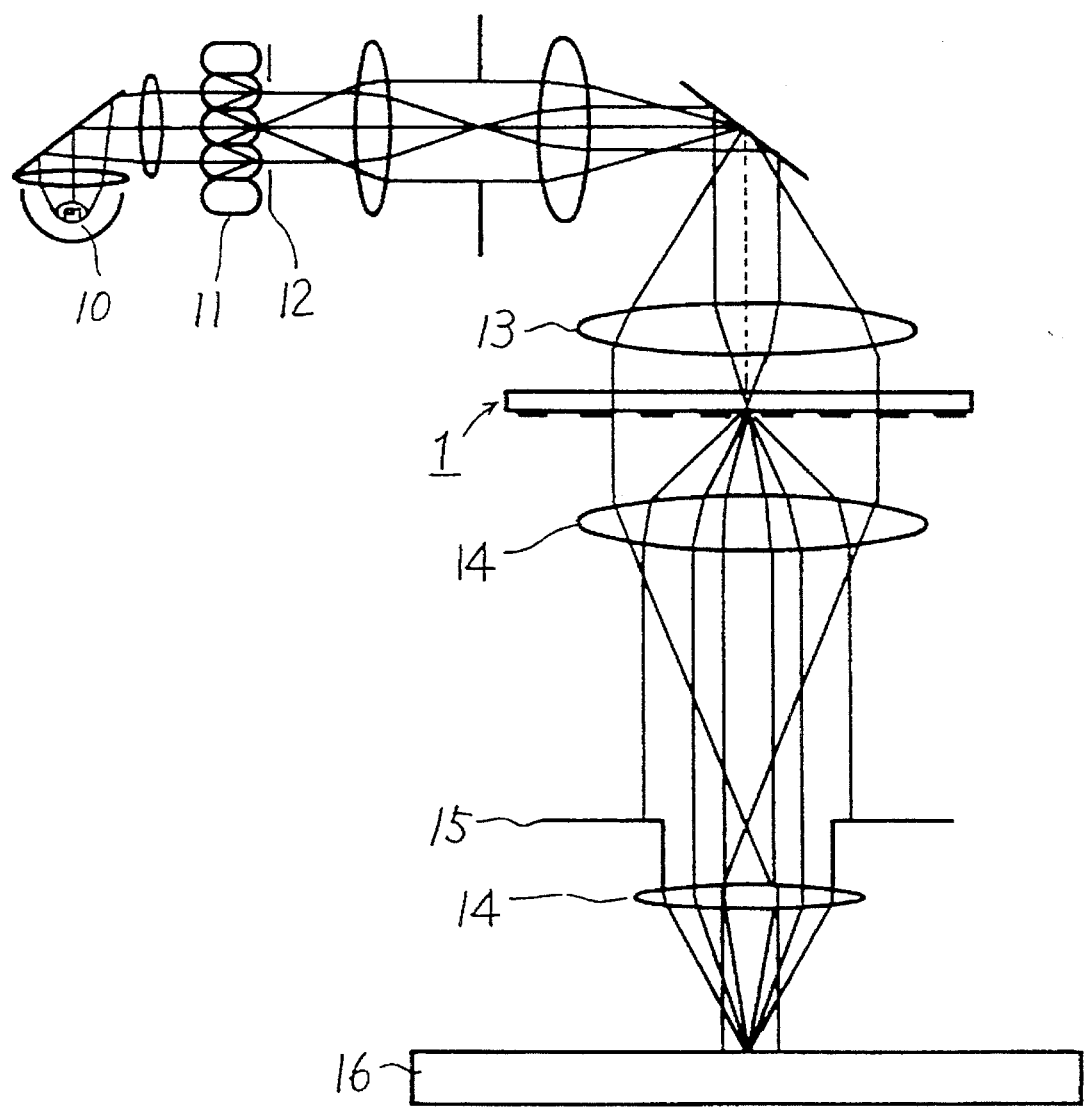
FIG. 7 is a schematic cross section of an optical system showing an example of an optical stepper commonly used at present.
Figure 8:
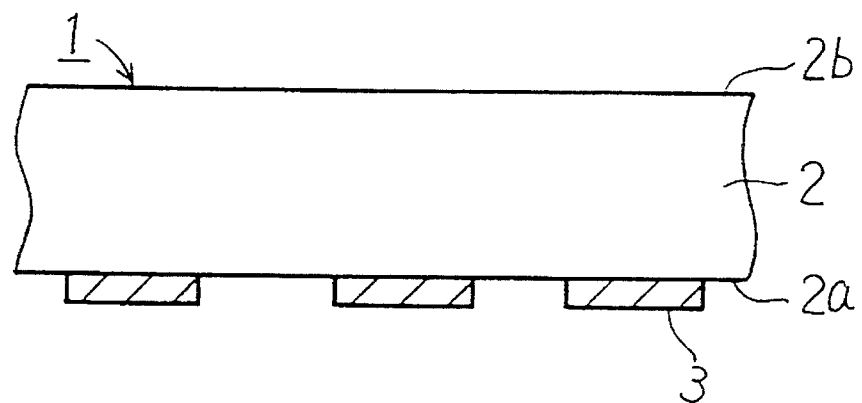
FIG. 8 is a schematic cross section of a conventional photomask.
Figure 9:
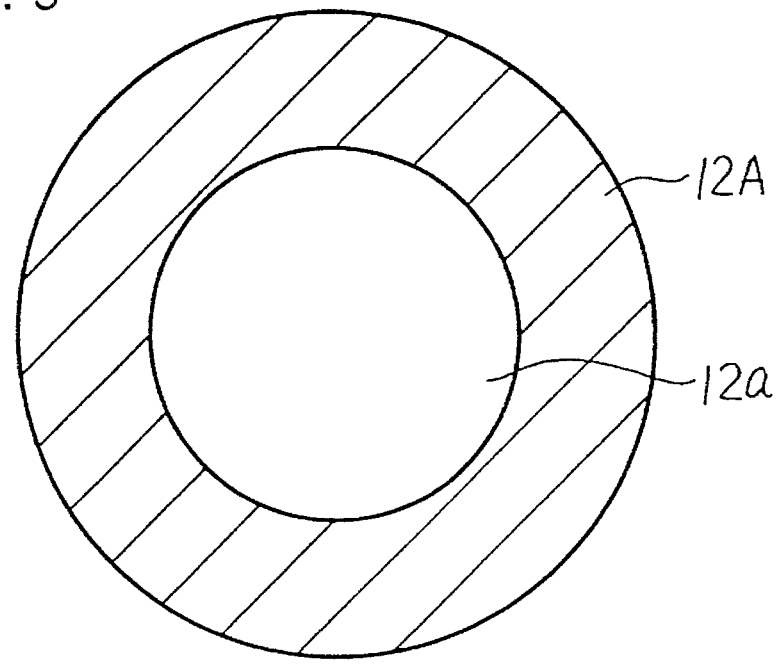
FIG. 9 is a plan view showing an example of a stop of an illumination optical system used in normal illumination.
Figure 10:
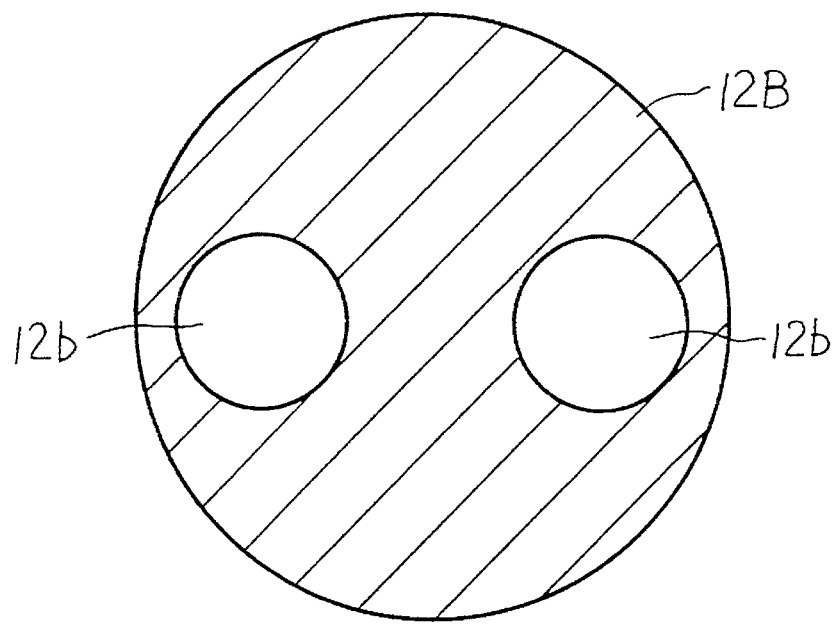
FIG. 10 is a plan view showing an example of a stop of the illumination optical system used in off-axis illumination.
Figure 11:
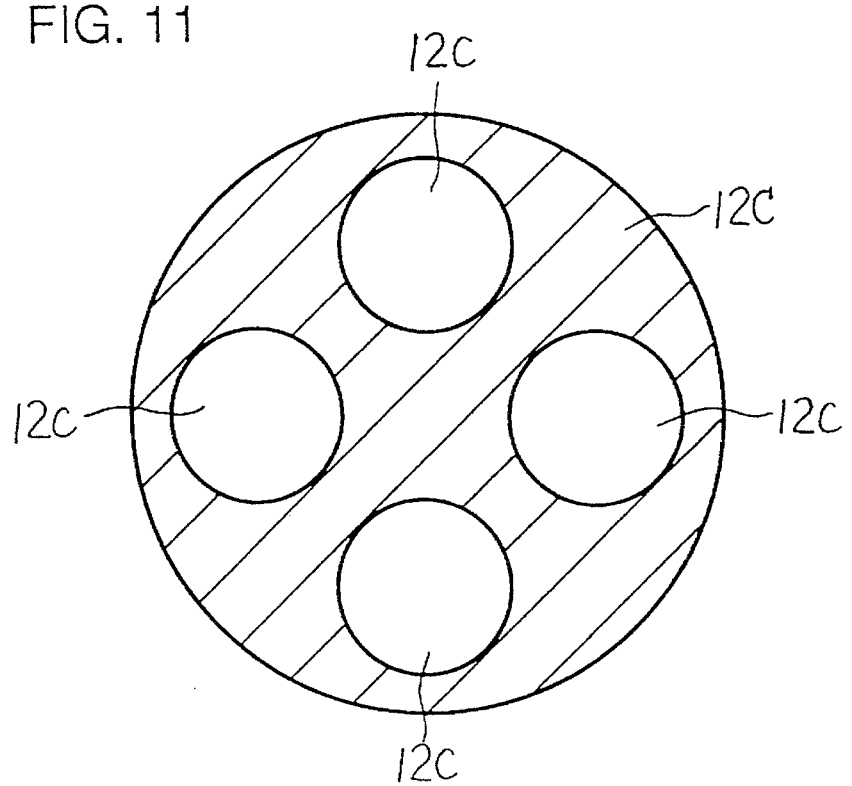
FIG. 11 is a plan view showing another example of a stop of the illumination optical system used in the off-axis illumination.
Figure 12:
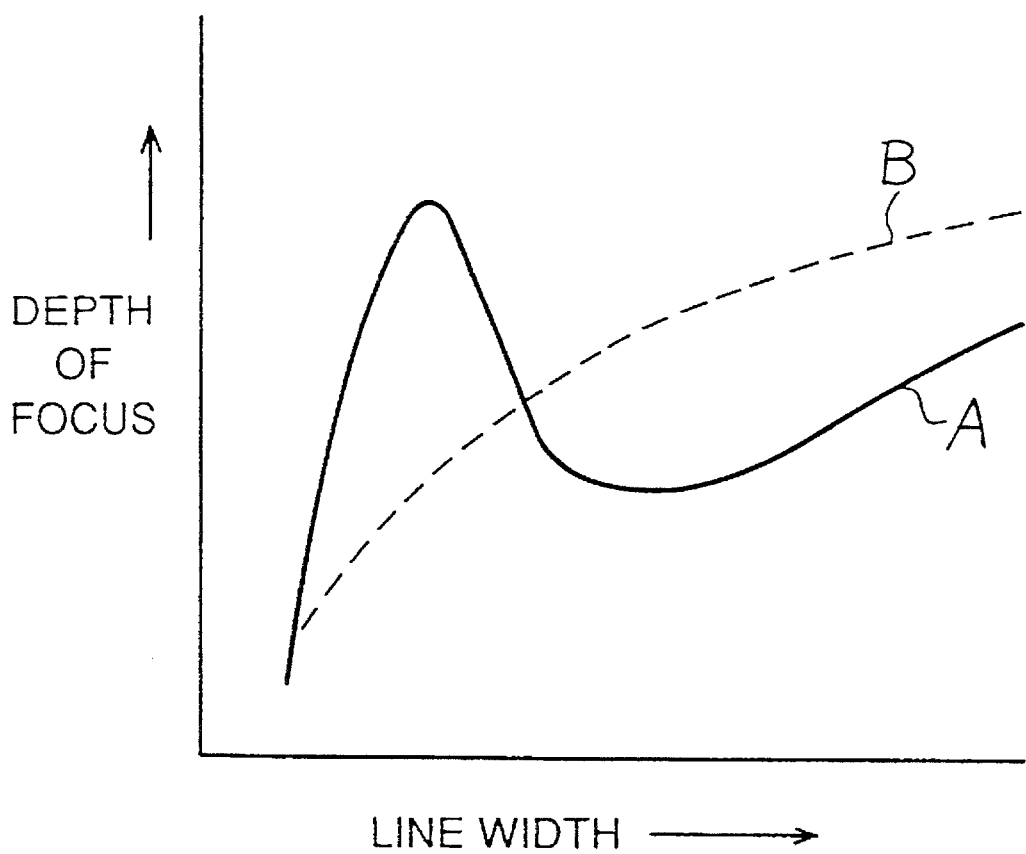
FIG. 12 is a graph showing the relation between a line width of a pattern and the depth of focus in the off-axis illumination.

In FIG. 1, a photomask in accordance with one embodiment of the present invention is schematically illustrated in a cross section. This photomask 1 includes a transparent substrate 2 which may be formed of, for example, quartz glass. Transparent substrate 2 has two main surfaces 2a and 2b opposite to each other. One main surface 2a is smooth, on which a light-shielding pattern 3 is formed. Irregularly distributed concaves and convexes are formed on the other main surface 2b. When the photomask of FIG. 1 is used in an optical stepper shown in FIG. 7, an illumination light is directed to light-shielding pattern 3 through main surface 2b having irregularly distributed concaves and convexes. The light passing through light-shielding pattern 3 is focused on a semiconductor substrate 16.

Figure 2:
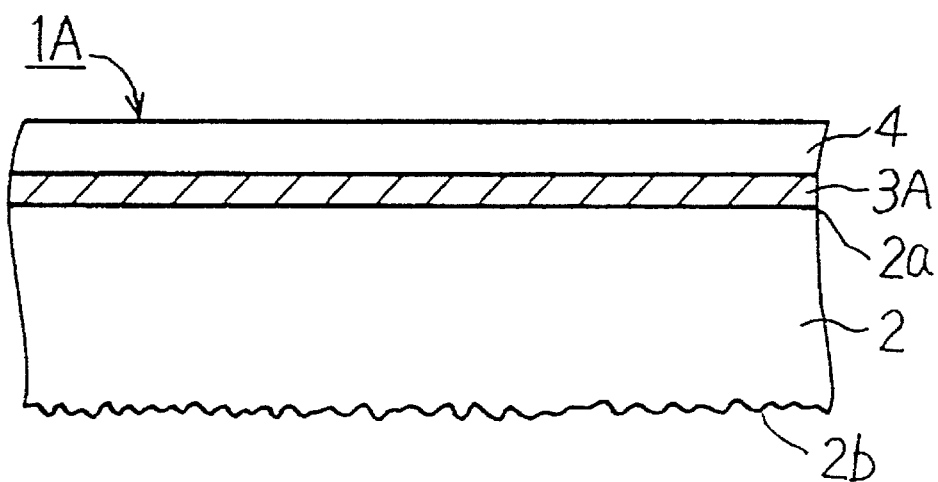
FIG. 2 is a schematic cross section of a photomask blank for manufacturing the photomask of FIG. 1.

FIG. 2 is a schematic cross section of a photomask blank used for manufacturing the photomask shown in FIG. 1. This photomask blank 1A includes transparent substrate 2 which may be formed of, for example, quartz glass. Irregularly distributed concaves and convexes are formed on one main surface 2b of transparent substrate 2. These concaves and convexes can be formed by etching using hydrogen fluoride gas or by mechanochemically polishing using alkali. A light-shielding layer 3A is formed on the other main surface 2a of transparent substrate 2. Light-shielding layer 3A can be formed of, for example, Cr. Light-shielding layer 3A may be formed including a plurality of sub-layers, each of which can be formed of Cr or $CrO_x$. An electron beam resist or photoresist layer 4 is deposited on light-shielding layer 3A.

In such a photomask blank, a pattern is transferred to electron beam resist or photoresist layer 4, and electron beam resist or photoresist layer 4 is developed. Light-shielding layer 3A is patterned by etching, using developed electron beam resist or photoresist layer 4 as a mask. Then, the photomask shown in FIG. 1 is obtained by removing resist layer 4.

Figure 3:
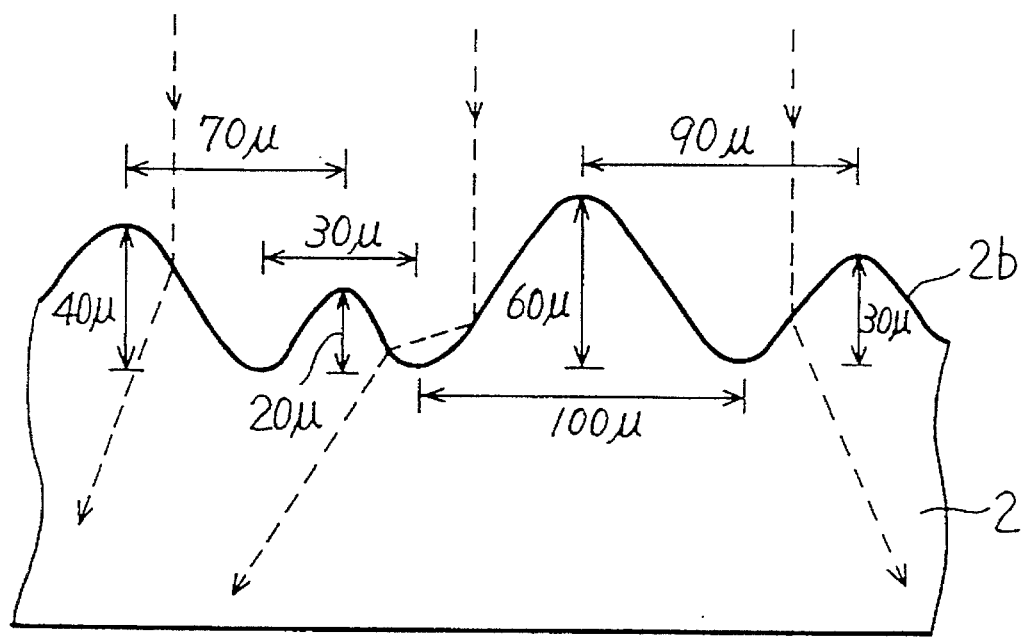
FIG. 3 is a schematic cross section showing one example of irregular concaves and convexes in the photomask of the present invention.

In FIG. 3, an example of main surface 2b having irregular concaves and convexes of photomask 1 shown in FIG. 1 is schematically illustrated in an enlarged cross section. As understood from the dimensions represented in μm by way of example in FIG. 3, peak heights of the concaves and convexes are varied. Spacings between peaks of the concaves and convexes are also varied. Therefore, when an illumination light enters as shown by dashed arrows, the incident light is refracted in various directions at a surface of those irregularly distributed concaves and convexes. As a result, wave number increases in various directions in a plane perpendicular to an optical axis of the illumination light. Thus, the value of σ increases, resulting in the improvement in contrast of a projected mask pattern.

It is obvious that the effect of such an scattering refraction can not be obtained if the peak height and the spacing between peaks of the concaves and convexes are less than a wavelength of the illumination light. Therefore, in order to obtain the effect of the present invention, at least the peak height and the spacing between peaks of the concaves and convexes should be larger than the wavelength of the illumination light. On the other hand, when the peak height and the spacing between peaks of the concaves and convexes are larger than 1000 times the wavelength of the illumination light, a projected image of the concaves and convexes overlaps with a projected image of the mask pattern. Accordingly, the peak height and the spacing between peaks of the concaves and convexes also need to be less than 1000 times the wavelength of the illumination light.

As described above, the effect of the present invention is expected when the peak height and the spacing between peaks of the concaves and convexes are larger than the wavelength of the illumination light, it is difficult to form a surface having irregular concaves and convexes with so small peak height and spacing between peaks. At present, g-line having a wavelength of 436 nm is generally used as an illumination light. In addition, in order to further improve resolution and the depth of focus, an attempt has been made to use i-line having the wavelength of 365 nm and KrF excimer laser having the wavelength of 248 nm as the illumination light. Since it is relatively easy to form a surface having irregular concaves and convexes with a peak height and a spacing between peaks of more than 10 μm, it is more desirable for the peak height and the spacing between peaks of the irregular concaves and convexes to be more than 50 times as large as the wavelength of the illumination light.

Figure 4:
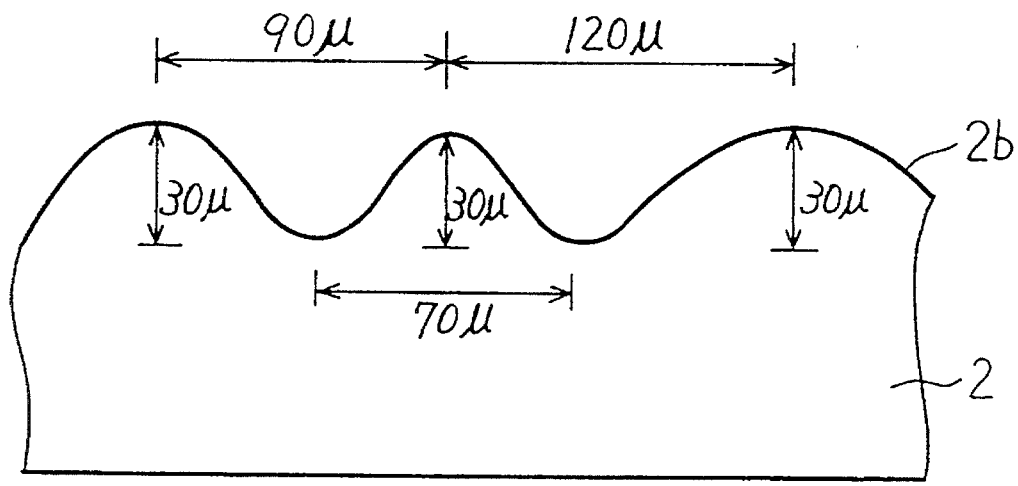
FIG. 4 is a schematic cross section showing another example of irregular concaves and convexes in the photomask of the present invention.

FIG. 4 shows a schematic cross section of another example of main surface 2b having irregular concaves and convexes. In FIG. 4, all the concaves and convexes have about the same height of 30 μm. However, spacings between peaks are varied. That is, the effect of the present invention can be obtained so long as the peak heights of the concaves and convexes are varied irregularly, even if spacings between peaks are constant.

Figure 5:
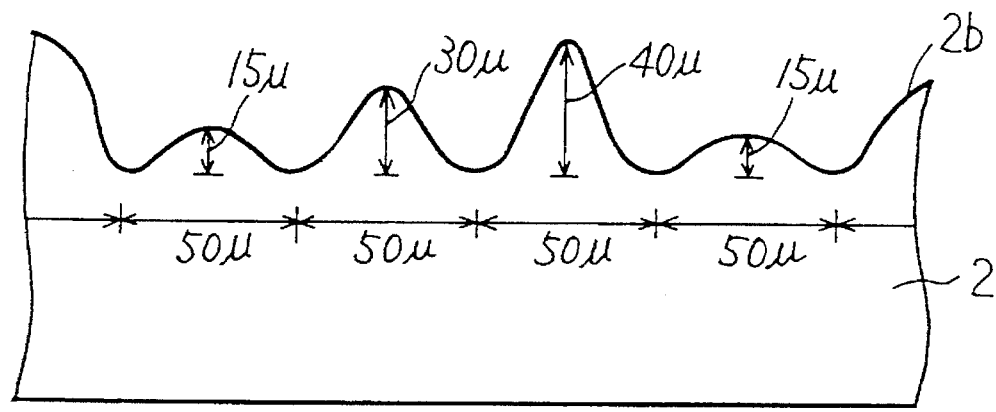
FIG. 5 is a schematic cross section showing a further example of irregular concaves and convexes in the photomask of the present invention.

FIG. 5 shows a schematic cross section of a further example of main surface 2b having irregular concaves and convexes. In FIG. 5, spacings between peaks of the concaves and convexes have substantially constant value of 50 μm. However, the peak heights of the concaves and convexes are varied. That is, the effect of the present invention can be obtained so long as the peak heights of the concaves and convexes are varied irregularly, even if the spacings between peaks of the concaves and convexes are almost constant.

Figure 6:
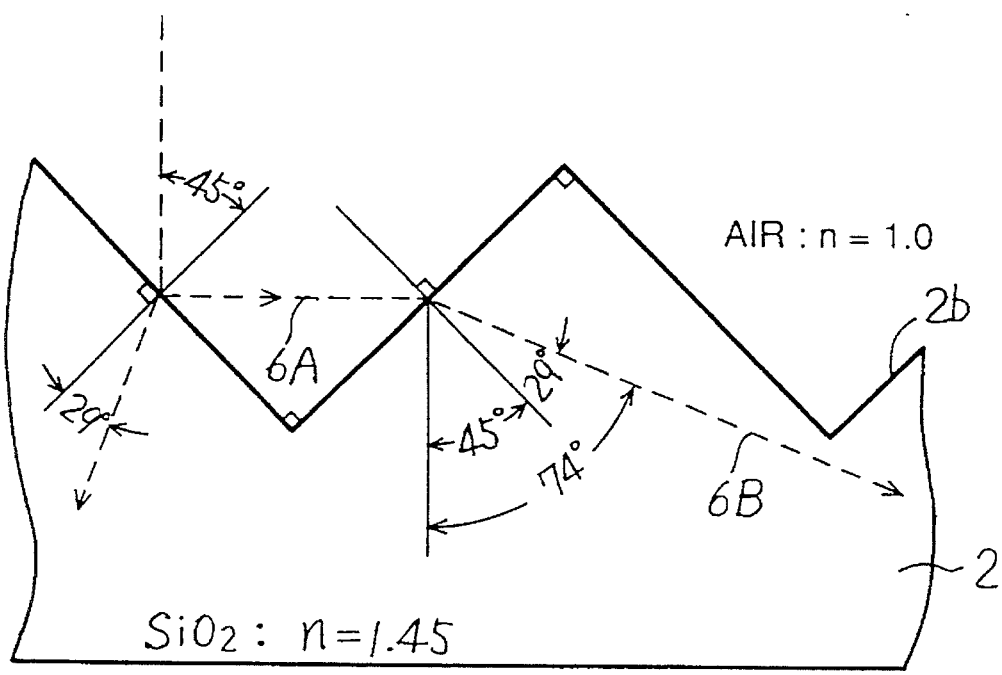
FIG. 6 illustrates scattering refraction of illumination light at the surface of concaves and convexes in the photomask of the present invention.

In FIG. 6, scattering refraction of the illumination light at the surface of the concaves and convexes is illustrated in more detail. For simplification of the description, in FIG. 6, each of slopes of the concaves and convexes forms an angle of 45° with the optical axis of the illumination light. If transparent substrate 2 is formed of $SiO_2$, transparent substrate 2 has a refractive index of n=1.45. On the other hand, air which is in contact with surface 2b of the concaves and convexes has a refractive index of n=1.0. Therefore, the illumination light having an incident angle of 45° enters transparent substrate 2 at an angle of refraction of 29°, while a light 6A reflected at the slope of the concaves and convexes enters transparent substrate 2 as shown by a dashed arrow 6B. Incident light 6B has an angle of 74° with respect to the optical axis of the illumination light. At this time, the numerical aperture of an illumination system is $Na_1=\sin\theta=\sin 74°=0.96$, since beam 6B has an angle of 74° with respect to the optical axis.

On the other hand, the maximum numerical aperture $NA_2$ of a projection system in an optical stepper used at present is about 0.6. As described above, the value as large as possible is used for the numerical aperture $NA_2$ of the projection system in order to improve resolution. If the numerical aperture of the illumination system is $NA_1=0.96$ and the numerical aperture of the projection system is $NA_2=0.6$, the coherence value is σ=0.96/0.6=1.6. Since $NA_1$ never exceeds 1, the maximum coherence value is theoretically $\sigma_{MAX}=1/0.6=1.67$. That is, a value of σ close to the theoretically maximum coherence value can be obtained by the photomask having a surface with irregular concaves and convexes in accordance with the present invention.

As understood from the above description, the photomask having a surface with irregular concaves and convexes in accordance with the present invention can improve process latitude in transfer of the mask pattern without using an off-axis illumination which is complex and not always useful for every pattern.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A photomask used in photolithography, comprising:
   a transparent substrate having two opposite main surfaces; and
   a light-shielding pattern formed on one of said main surfaces; wherein
   the other of said main surfaces includes a plurality of randomly distributed concaves and convexes, spacings and heights of said concaves and convexes being within a range from 50 to 1000 times a wavelength of light used in said photolithography.

2. The photomask according to claim 1, wherein
   said light is one selected from the group consisting of g-line having a wavelength of 436 nm, i-line having a wavelength of 365 nm, and KrF excimer laser having a wavelength of 248 nm.

3. A photomask blank for manufacturing a photomask used in photolithography, comprising:
   a transparent substrate having two opposite main surfaces;
   a light-shielding layer formed on one of said main surfaces; and
   an electron beam resist or photoresist layer formed on said light-shielding layer; wherein
   the other of said main surfaces includes a plurality of randomly distributed concaves and convexes, spacings and heights of said concaves and convexes being within range from 50 to 1000 times a wavelength of light used in said photolithography.

4. The photomask blank according to claim 3, wherein
   said light is one selected from the group consisting of g-line having a wavelength of 436 nm, i-line having a wavelength of 365 nm, and KrF excimer laser having a wavelength of 248 nm.

* * * * *